(12) United States Patent
Seok et al.

(10) Patent No.: US 8,520,422 B2
(45) Date of Patent: Aug. 27, 2013

(54) SEMICONDUCTOR MODULES AND SIGNAL LINE LAYOUT METHODS THEREOF

(75) Inventors: Jong-hyun Seok, Seoul (KR); Dohyung Kim, Yongin-si (KR); Jonghoon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 485 days.

(21) Appl. No.: 12/662,844

(22) Filed: May 6, 2010

(65) Prior Publication Data

US 2011/0096583 A1 Apr. 28, 2011

(30) Foreign Application Priority Data

Oct. 23, 2009 (KR) .................. 10-2009-0101212

(51) Int. Cl.
*G11C 5/02* (2006.01)
(52) U.S. Cl.
USPC .............................. 365/51; 365/52
(58) Field of Classification Search
USPC ......................... 365/51, 52, 230.03
See application file for complete search history.

(56) References Cited

U.S. PATENT DOCUMENTS

| | | | |
|---|---|---|---|
| 6,658,530 | B1 | 12/2003 | Robertson et al. |
| 2007/0195609 | A1* | 8/2007 | Kim et al. ................ 365/185.29 |
| 2009/0195295 | A1* | 8/2009 | Uematsu et al. ............... 327/530 |
| 2010/0259338 | A1* | 10/2010 | Jow et al. ........................ 333/33 |

FOREIGN PATENT DOCUMENTS

| | | |
|---|---|---|
| JP | 07-058278 | 3/1995 |
| KR | 10-2001-0038930 | 5/2001 |
| KR | 10-2003-0021901 | 3/2003 |

* cited by examiner

*Primary Examiner* — Huan Hoang
(74) *Attorney, Agent, or Firm* — Harness, Dickey & Pierce, P.L.C.

(57) ABSTRACT

A memory module and a layout method of the memory module. The memory module includes memory devices connected to corresponding tabs through corresponding damping resistors formed on a printed circuit board and includes a first signal line group in a first region between the memory devices and the damping resistors and a second signal line group in a second region between the corresponding damping resistors and the connecting terminals.

19 Claims, 15 Drawing Sheets

SEMICONDUCTOR MODULES AND SIGNAL LINE LAYOUT METHODS THEREOF

CROSS-REFERENCE TO RELATED APPLICATION

This non-provisional application claims priority under 35 U.S.C. §119 to Korean Patent Application No. 10-2009-0101212, filed on Oct. 23, 2009, the entire contents of which is herein incorporated by reference.

BACKGROUND

1. Field

Example embodiments of the inventive concepts relate to semiconductor modules, and more particularly to semiconductor modules suitable as scale-down sized modules and a layout method of signal lines thereof.

2. Description of the Related Art

Generally, memory modules on which semiconductor memories are mounted have been used as a data storage medium in a data processing system (e.g., a personal computer, a workstation, a server computer, and/or a telecommunication system). As high speed data processing operations of large sized multimedia data has been demanded, environments including the data processing system have been changed to high density, high integration, high performance, and/or miniaturization. According to this trend, the number of connecting pins of a memory module is increased but the size of memory module is decreased.

If the size of a memory module is decreased, a layout margin of all signal lines coupled to electrical connecting pads of memory devices mounted on a printed circuit board of the memory module may be reduced, which may cause crosstalk, signal distortion and/or signal noise. Accordingly, layout techniques for signal lines that are suitable for more compact memory modules may be necessary.

SUMMARY

According example embodiments of the inventive concepts a semiconductor module may include integrated circuit devices mounted on a portion of surface of a printed circuit board in a first direction of the printed circuit board, decoupling parts spaced from the integrated circuit devices in a second direction of the printed circuit board, connecting terminals spaced from the decoupling parts in the second direction, and signal lines for connecting the integrated circuit devices to corresponding one of decoupling parts in both a first distance region between the integrated circuit devices and the decoupling parts and a second distance region between the decoupling parts and the connecting terminals.

According example embodiments of the inventive concepts a semiconductor module may include a substrate, a plurality of integrated circuit devices on a surface of the substrate, a plurality of decoupling parts on the substrate, a plurality of connecting terminals on the substrate, and a plurality of signal lines connecting the integrated circuit devices to the decoupling parts, the signal lines in a first region between the integrated circuit devices and the decoupling parts and a second region between the decoupling parts and the connecting terminals.

If the printed circuit board includes multiple layers, the signal lines may be formed on one of internal layers and connected to the surface of the printed circuit board through corresponding via holes.

According example embodiments of the inventive concepts a semiconductor module may include, a semiconductor module may include integrated circuit devices mounted on a surface of a printed circuit board, decoupling parts spaced from the integrated circuit device in a first direction of the printed circuit board and disposed to be shorter than the dispersion length of the integrated circuit devices in a second direction of the printed circuit board, connecting terminals spaced from the decoupling parts in the first direction and disposed on edge of the printed circuit board to correspond to the dispersion length of the decoupling parts in the second direction and signal lines for connecting the integrated circuit devices to corresponding one of decoupling parts in both a first distance region between the integrated circuit devices and the decoupling parts and a second distance region between the decoupling parts and the connecting terminals.

If the integrated circuit devices are memory devices, the decoupling parts may include damping resistors or capacitors. If the first direction is the height of the printed circuit board, the second direction may be the length of the printed circuit board. If the connecting terminals are tabs of the module, the tabs may be connected to a memory controller through a socket. The signal lines may be lines for transferring data, addresses.

According example embodiments of the inventive concepts a semiconductor module may include a memory module including memory devices mounted on a surface of a printed circuit board including multiple layers, decoupling parts spaced from the memory devices in a first direction of the printed circuit board and disposed to be shorter than the dispersion length of the memory devices in a second direction of the printed circuit board, connecting terminals spaced from the decoupling parts in the first direction and disposed on edge of the printed circuit board to correspond to the dispersion length of the decoupling parts in the second direction, and a first signal line group in a first distance region between the memory devices and the decoupling parts and a second signal line group in a second distance region between the decoupling parts and the connecting terminals, to connect the memory devices to the decoupling parts.

The first and the second signal line groups may be formed in at least one internal layer of the multiple layers through corresponding via holes. The decoupling parts may include resistors or capacitors to suppress noise of signal and to improve signal integrity.

According example embodiments of the inventive concepts a semiconductor module may include memory devices connected to corresponding tabs through corresponding damping resistors formed on a printed circuit board including a first signal line group in a first distance region between the memory devices and the damping resistors and a second signal line group in a second distance region between the corresponding damping resistors and the connecting terminals, to connect the memory devices to the corresponding tabs.

The first distance region may be narrower than the second distance region in a height direction of the printed circuit board. The first distance region may be broader than the second distance region in a height direction of the printed circuit board. The first and the second signal line groups may be lines for transferring data.

According to example embodiments of the inventive concepts a data processing system may include a memory controller, a processor connected to the memory controller and processing a requested data operation, and a memory module connected to the memory controller, where the memory module includes memory devices connected to corresponding tabs through damping resistor part formed on a printed circuit board, and a first signal line group in a first distance region between the memory devices and the damping resistors and a second signal line group in a second distance region between the corresponding damping resistors and the connecting terminals, to connect the memory devices to the corresponding tabs.

According to example embodiments of the inventive concepts a data processing system may include a memory controller, a processor connected to the memory controller, the processor configured to process a requested data operation and a memory module connected to the memory controller, the memory module including a plurality of memory devices connected to a plurality of tabs through a plurality of damping resistor parts on a printed circuit board, a first signal line group in a first region between the memory devices and the damping resistor parts, and a second signal line group in a second region between the damping resistor parts and the connecting terminals.

The first and the second signal groups may be formed in an internal layer of the printed circuit board. The first and the second signal groups may be lines for transferring data, commands, or addresses. The data processing system may be a computer or a multi media electronic apparatus.

According to example embodiments of the present inventive concepts a method of layout of signal lines in a memory module including memory devices connected to corresponding tabs through corresponding damping resistor parts formed on a printed circuit board may include disposing damping resistor part to be exchanged each other that is connected to the corresponding memory devices, and forming a first signal line group in a first distance region between the memory devices and the damping resistor part and a second signal line group in a second distance region between the corresponding damping resistor part and the connecting terminals, to connect the memory devices to the corresponding tabs.

According to example embodiments of the present inventive concepts a memory module signal line layout method may include arranging memory devices on a printed circuit board, arranging damping resistor parts on the printed circuit board, the damping resistor parts having exchangeable positions such that the damping resistor parts are positioned based on a selected routing of signal lines, arranging tabs on the printed circuit board, the memory devices connected to the tabs through the damping resistor parts, arranging a first signal line group in a first region between the memory devices and the damping resistor parts, and arranging a second signal line group in a second region between the damping resistor parts and the connecting tabs.

The step of damping resistor part may be to exchange the position of the adjacent damping resistor part.

BRIEF DESCRIPTION OF THE DRAWINGS

Example embodiments of the inventive concepts will be more clearly understood from the following brief description taken in conjunction with the accompanying drawings.

FIGS. 1 and 2 are plan views of memory modules according to example of embodiments of the inventive concepts;

FIG. 3 is a diagram of a printed circuit board illustrating a conventional signal line layout of the memory modules illustrated in FIGS. 1 and 2;

FIG. 4 is a diagram of a printed circuit board illustrating a portion of a memory module having a signal layout according to example embodiments of the inventive concepts;

FIG. 5 is a diagram of a printed circuit board illustrating a portion of a memory module according to example of embodiments of the inventive concepts;

FIG. 6 is a diagram of a printed circuit board illustrating an example layout of the memory module of FIG. 5 according to example of embodiments of the inventive concepts;

FIG. 7 is a diagram illustrating internal layer detail of the printed circuit board of FIG. 6 according to example of embodiments of the inventive concepts;

FIG. 8 is a diagram illustrating the positions of components to be mounted over the layout pattern of the internal layer of FIG. 7 according to example of embodiments of the inventive concepts;

FIG. 9 is a diagram of a printed circuit board illustrating tab signaling formed on the upper and lower layer of a memory module including the layout pattern of FIG. 7;

FIGS. 10 and 11 are plan views of memory modules that may include a signal line layout according to example of embodiments of the inventive concepts;

FIG. 12 is a diagram illustrating a memory system including a memory module according to example of embodiments of the inventive concepts;

FIG. 13 is a block diagram illustrating a data processing system according to example of embodiments of the inventive concepts;

FIG. 14 is a block diagram illustrating details of the data processing system of FIG. 13;

FIGS. 15 and 16 are diagrams of printed circuit boards illustrating a portion of a memory module according to example embodiments of the inventive concepts; and FIG. 17 is a diagram of a printed circuit board illustrating a portion of a memory module according to example of embodiments of the inventive concepts.

Figure 1:
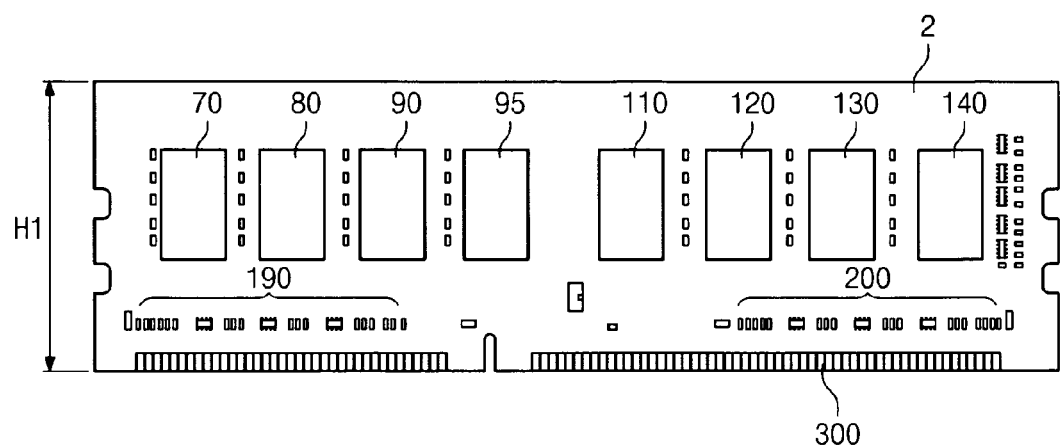
FIGS. 1-17 represent non-limiting, example embodiments as described herein.

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
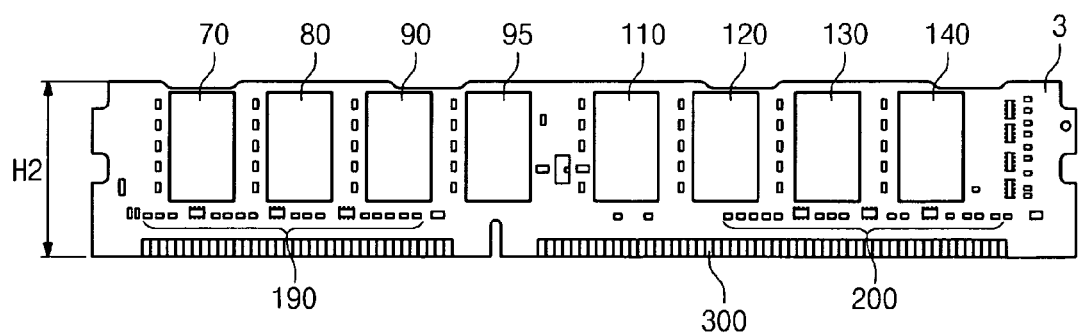

FIGS. 1 and 2 are plan views of memory modules 2 and 3, respectively, according to example of embodiments of the inventive concepts. The memory module 3 of FIG. 2 may be a shorter height H2 than the height H1 of the memory module 2 of FIG. 1. The memory module 2 may be a RDIMM (Registered Dual In Line Memory Module) and the memory module 3 may be a VLP (Very Low Profile) RDIMM. For example, the VLP RDIMM of FIG. 2 may be 18.75 mm high and 133.35 mm long, and the RDIMM may be 30 mm high and 133.35 mm long (e.g., the same size as JEDEC standards). The VLP RDIMM may have the same length of the RDIMM.

The memory modules 2 and 3 of FIGS. 1 and 2 may include a plurality of memory devices 70-140 (e.g., 70, 80, 90, 95, 110, 120, 130 and/or 140) mounted on a surface layer (uppermost layer and/or lowermost layer) of a printed circuit board in the length direction. The memory modules 2 and 3 may include decoupling parts 190 and/or 200 spaced away from the plurality of memory devices 70-140 in a height direction. The decoupling parts 190 and 200 may be an array of damping registers and capacitors preventing and/or reducing a signal reflection, for example, overshoot and undershoot. There may be a tab 300 at the edge of the memory modules along the length direction for electrical connection with an external device, for example, a controller (not shown). The tab 300 may include a plurality of connecting terminals each of which may be called a tab pin.

In a case where the printed circuit board of the memory modules 2 and 3 include multiple layers, signal lines may be located in an internal layer of the multiple layers and may connect each of electrical connecting pads of the memory devices 70-140 to a corresponding one of the decoupling parts 190 and 200. The signal lines may function to transfer at least one of control signals, address signals, input/output data and powers (Vcc, Vdd, Vss).

Figure 3:
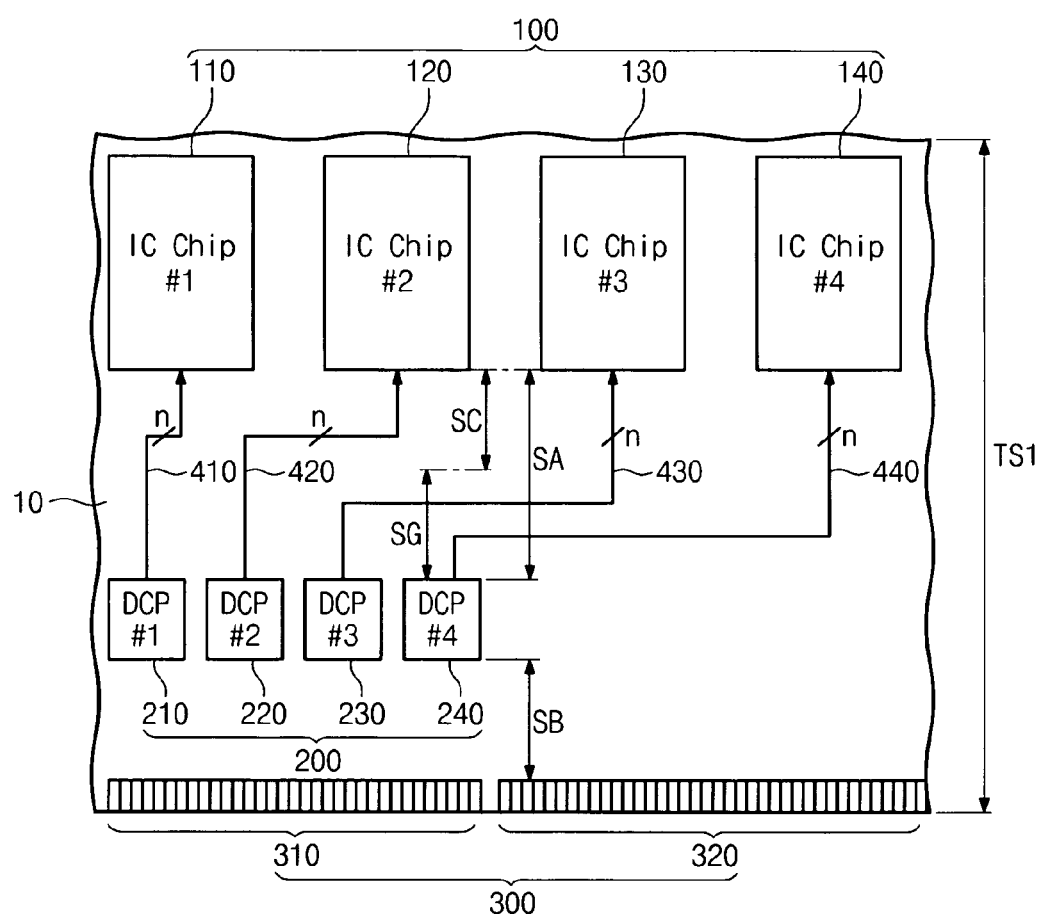
Figure 4:
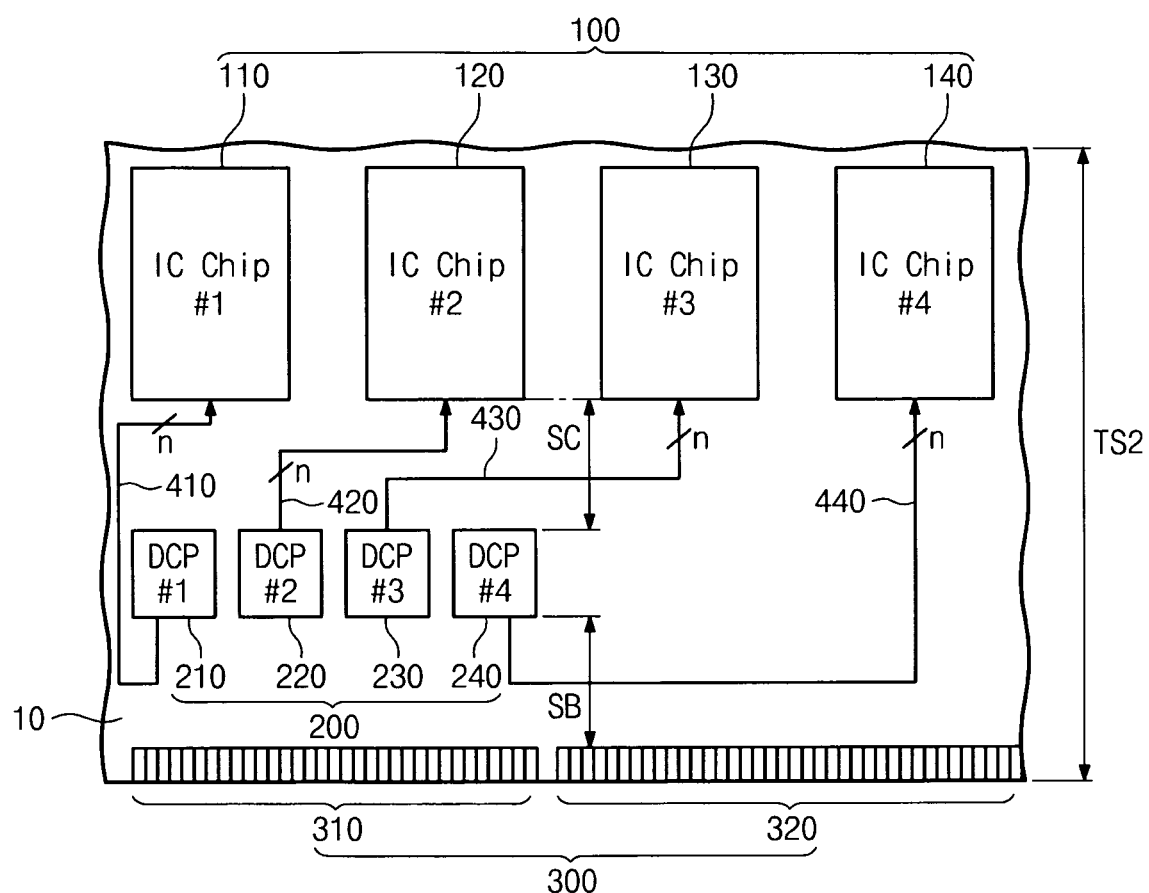

FIG. 3 is a diagram of a printed circuit board illustrating a conventional signal line layout of the memory modules illustrated in FIGS. 1 and 2. FIG. 4 is a diagram of a printed circuit board 20 illustrating a portion of a memory module having a signal layout according to example embodiments of the inventive concepts. Referring to the printed circuit board 10 of FIG. 3, memory devices 100 may include memory devices 110, 120, 130 and/or 140. Decoupling parts 200 may include decoupling parts 210, 220, 230 and/or 240. Signal lines 410, 420, 430, and 440 may be connected between the memory devices 110-140 and the decoupling parts 210-240, respectively. Tab 300 may include tabs 310 and/or 320, shown in the printed circuit board 10. A distance region SB may be between the decoupling parts 200 and the tab 300 in the length direction.

Referring to FIGS. 3 and 4, the height TS1 of the memory module of FIG. 3 may be reduced to the height TS2 of the memory module of FIG. 4. If signal lines 410-440 are in a first distance region SA as shown in FIG. 3, crosstalk among signal lines may be caused due to the narrow space for signal routing. If the first distance region SA is reduced to a distance region SC of FIG. 4 by reducing and/or eliminating the height of the memory module gap region SG, signal integrity of control signals, address signals, input/output data and/or power may be deteriorated because of crosstalk among signal lines.

According to example embodiments of the inventive concepts, a signal layout of a memory module may include signal lines routed as illustrated in FIG. 4. Referring to FIG. 4, the memory module having a height TS2 that may be shorter than the height TS1 of a memory module as shown in FIG. 3 may have a layout structure suitable for reducing and/or minimizing signal crosstalk. As shown in FIG. 4, for example, a portion of signal lines 410 and 440 may be on both the first distance region SC and the second distance region SB. Signal lines 420 and 430 may be on the first distance region SC. Signal lines may be dispersed in the whole of the printed circuit board 10, so that it is possible to have the maximum and/or improved spacing among signal lines 410-440. Crosstalk among signal lines may be reduced and/or minimized. For example, where the signal lines 410-440 are used for data signals, the number of signal lines may be, for example, 8 and/or 16.

The decoupling parts 200 on the memory module of FIG. 4 may be shorter than the length of the memory devices 100 in the length direction of the printed circuit board 10. For example, the decoupling parts 200 and the spaces between the decoupling parts 200 may be shorter lengthwise than the memory devices 100 and the spaces between the memory devices 100. Data connecting terminals 310 for transferring data in the tab 300 may have a length corresponding to the length of the decoupling parts 200 in the length direction of the printed circuit board 10. For example, the data connecting terminals 310 may be as long as the decoupling parts 200 and the spaces between the decoupling parts 200. Connecting terminals 320 may be used for, for example, commands, addresses and/or powers.

Figure 9:
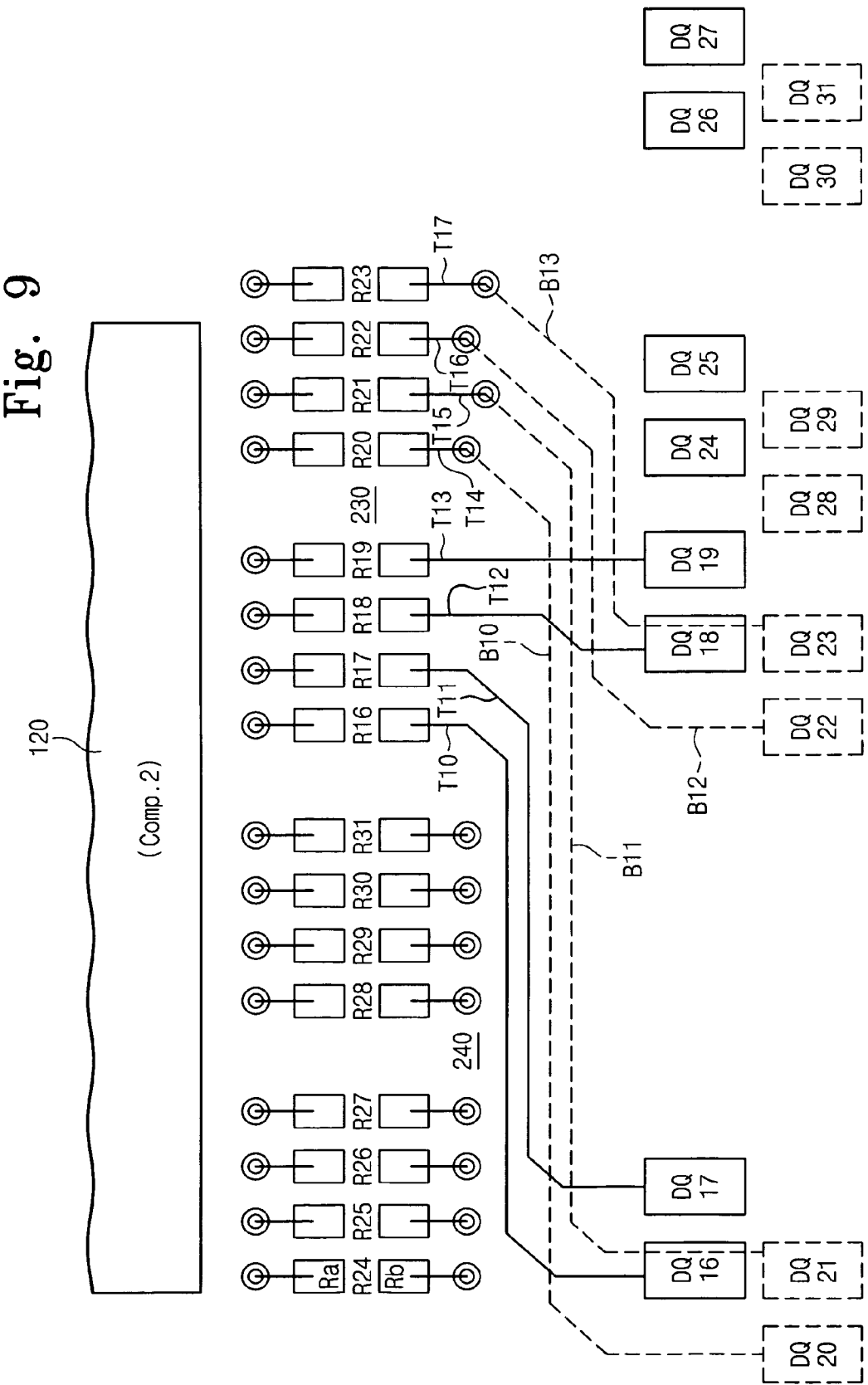

Although example embodiments of the inventive concepts are described with reference to memory modules, example embodiments are not so limited. For example, if the memory module of FIG. 4 is not a memory module, the memory devices 100 may be any integrated circuit devices. The decoupling parts 200 may include damping resistor arrays and/or capacitors. Where the decoupling parts 200 include damping resistor arrays, as shown in FIG. 9, one data tab pin may correspond to two resistors connected in series (e.g. DQ19 corresponding to R19)

The printed circuit board 10 with signal lines may include a plurality of layers. For example, in a printed circuit board having 6 layers where the uppermost layer is the first layer, the memory devices 100, the decoupling parts 200 and the tab 300 may be on the uppermost layer and/or on a lowermost layer. The signal lines 410 to 440 may be in, for example, a third layer. Power lines may be on a second layer and/or the fifth layer. Each of the layers may be electrically isolated by an insulating material, for example, a pre-preg. Electrical connection among each layer may be through vias that penetrate the insulating material.

Figure 5:
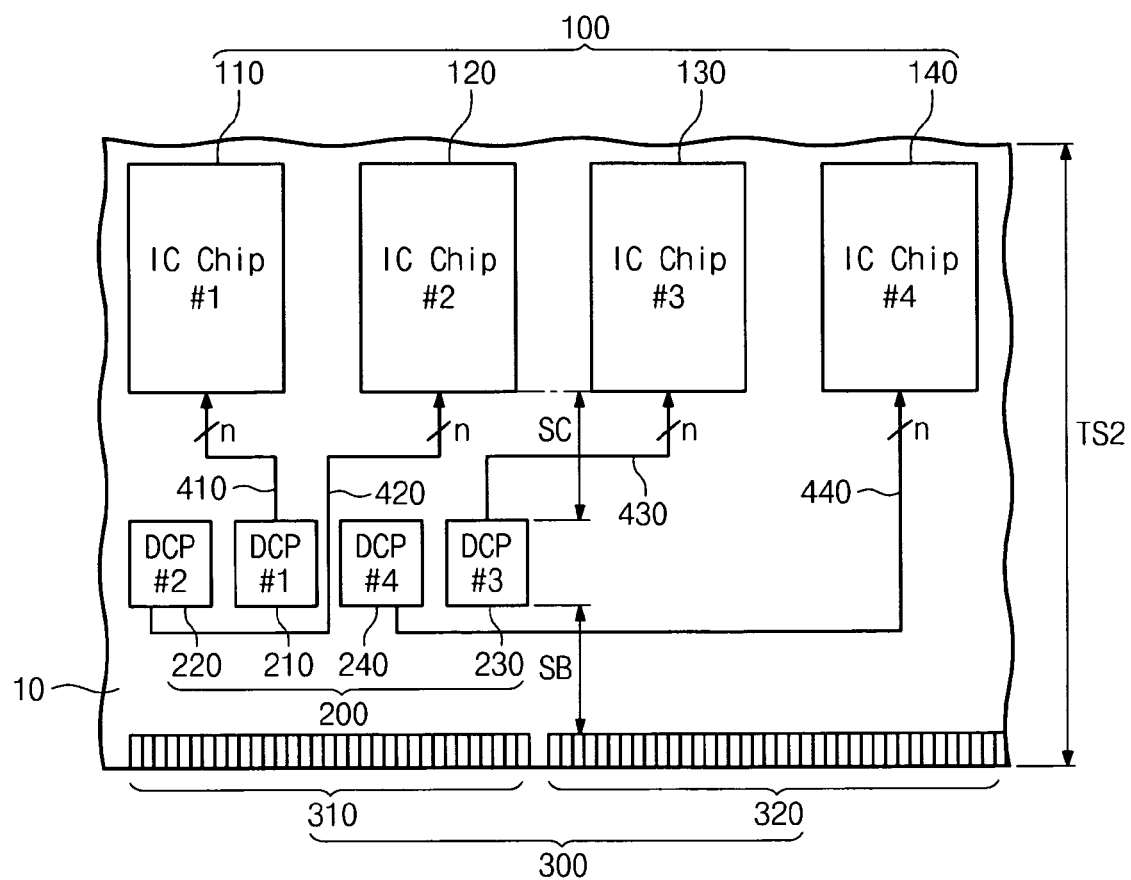

FIG. 5 is a diagram of a printed circuit board illustrating a portion of a memory module according to example embodiments of the inventive concepts. Referring to FIGS. 4 and 5, part of signal lines 420 and 440 are in the second distance region SB. According to FIG. 4, a position of decoupling parts 200 corresponding to memory devices 100 may not change. According to FIG. 5, the position of each of decoupling parts 210-240 may be changed to provide a more flexible layout of signal lines (e.g., the decoupling parts 200 may be reordered).

Figure 17:
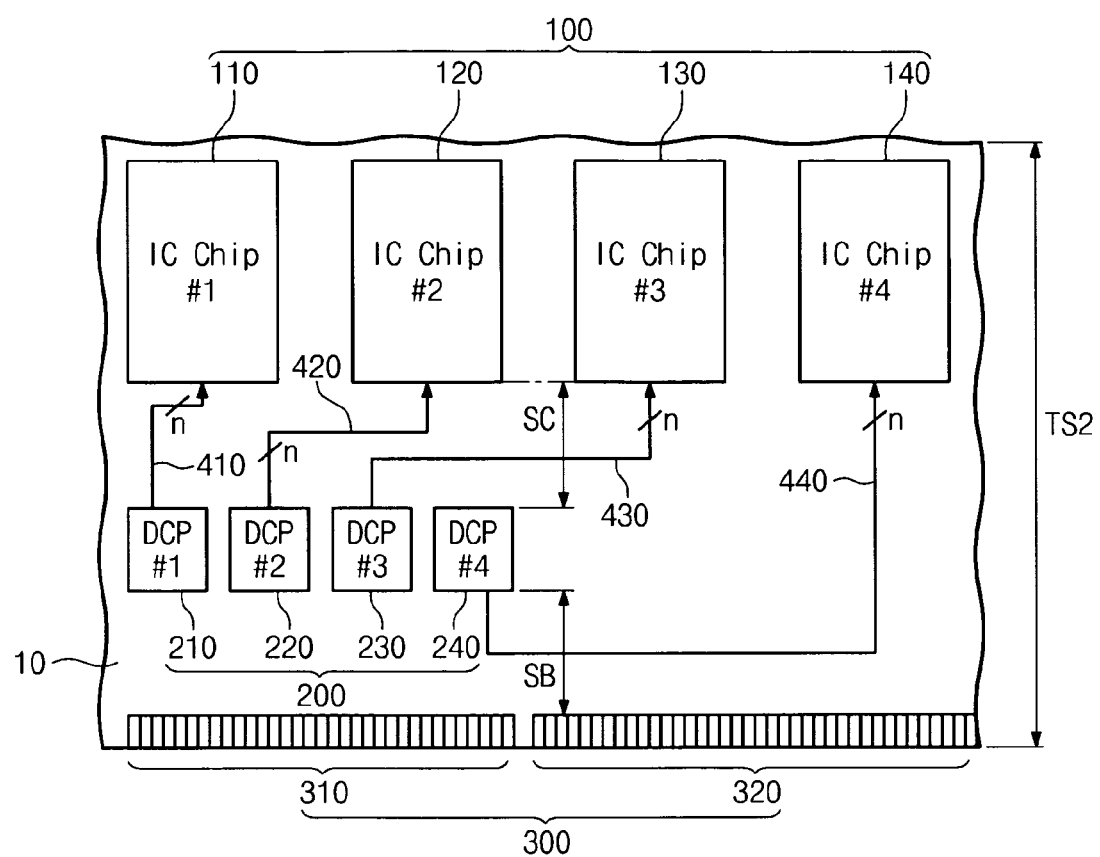

FIG. 17 is a diagram if a printed circuit board illustrating a portion of a memory module according to examples of embodiments of the invention concepts. The memory module of FIG. 17 may be substantially similar to that of FIG. 4. Referring to FIG. 17, according to example embodiments of the inventive concepts, signal line 440 is in the second distance region SB. Signal lines 410-430 are in the first distance region SC.

Referring to FIGS. 4 and 5, in FIG. 5, a portion of signal lines 420 and 440 of the signal lines 410-440 are in the second distance region SB. The first decoupling part 210 and the second decoupling part 220 may have exchanged their positions relative to FIG. 4 and the third decoupling part 230 and the forth decoupling part 240 may have exchanged their positions relative to FIG. 4. The first decoupling part 210 and the second decoupling part 220, which are adjacent, may be exchanged in the length direction of the printed circuit board. The third decoupling part 230 and the forth decoupling part 240, which are adjacent, may be exchanged in the length direction of the printed circuit board.

Referring to FIG. 5, signal lines 420 and 440 may be in both the first distance region SC and the second distance region SB, and distance among signal lines 410-440 may be maximized and/or increased. Signal line crosstalk may be reduced. For example, where signal lines 410-440 are used for data signals, the number of signal lines may be, for example, 8 and/or 16. The decoupling parts 200 on the memory module of FIG. 5 may have a length that is shorter than the length of memory devices 100 disposed in the length direction of the printed circuit board 10. For example, the decoupling parts 200 and the spaces between the decoupling parts 200 may be shorter lengthwise than the memory devices 100 and the spaces between the memory devices 100. Data connecting terminals 310 for transferring data in the tab 300 may have a length corresponding to the length of the decoupling parts 200 in the length direction of the printed circuit board 10. For example, the data connecting terminals 310 may be as long as the decoupling parts 200 and the spaces between the decoupling parts 200. Connecting terminals 320 may be for, for example, command signals, address signals and/or power signals.

Where the printed circuit board 10 of the memory module of FIG. 5 has 6 layers, the uppermost layer being the first layer, the memory devices 100, the decoupling parts 200 and the tab 300 may be mounted on the uppermost layer and/or a lowermost layer. The signal lines 410-440 may be on, for example, the third layer. Power lines may be on, for example, the second layer and/or the fifth layer. By exchanging position of some of the decoupling parts 200, if the decoupling parts 200 are mounted in order of the second decoupling part 220, the first decoupling part 210, the fourth decoupling part 240 and the third decoupling part 230, the signal lines 410 and 430 may be on an internal layer (e.g. the third layer) vertically located under or over the first distance region SC. A portion of the signal lines 420 and 440 may be on an internal layer (e.g. the third layer) vertically under or over the second distance region SB. The distance of signal lines 410-440 on the internal layer may be maximized and/or increased so that signal crosstalk is minimized and/or reduced. A signal line layout may be more flexible.

Although example embodiments of the inventive concepts are described with reference to memory modules, example embodiments are not so limited. For example, if the memory module of FIG. 5 is not a memory module, the memory devices 100 may be any integrated circuit devices and the memory module may be a semiconductor module functioning with special roles assigned to the integrated circuit devices. Similarly, the decoupling parts 200 may include damping resistor arrays and/or capacitors. Where the decoupling parts 200 include damping resistor arrays, for example as shown in FIG. 9, one data tab pin may correspond to two resistors connected in series (e.g. DQ18 corresponding to R18). Comparing FIG. 5 to FIG. 4, signal lines may be in the second distance region SB and the position of decoupling parts 200, each connected to corresponding memory devices, may be exchanged.

Figure 15:
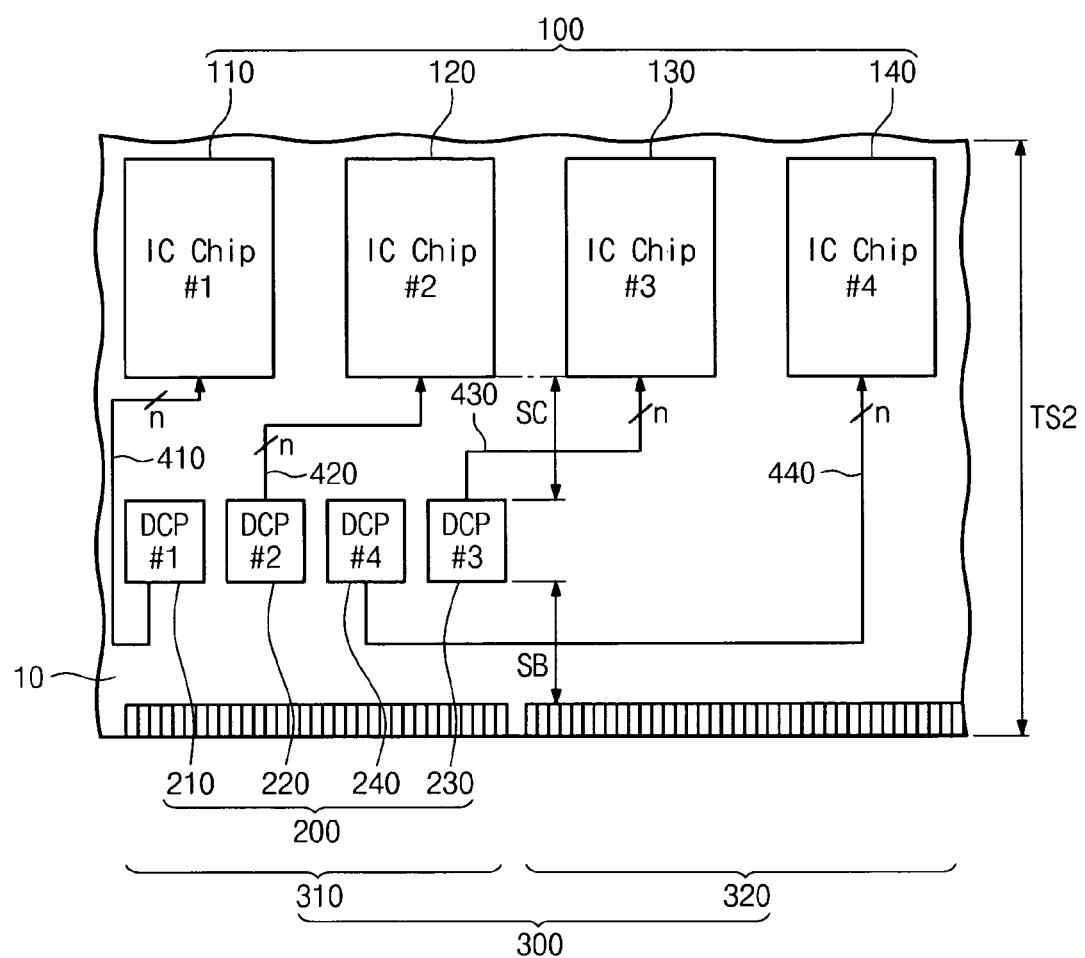
Figure 16:
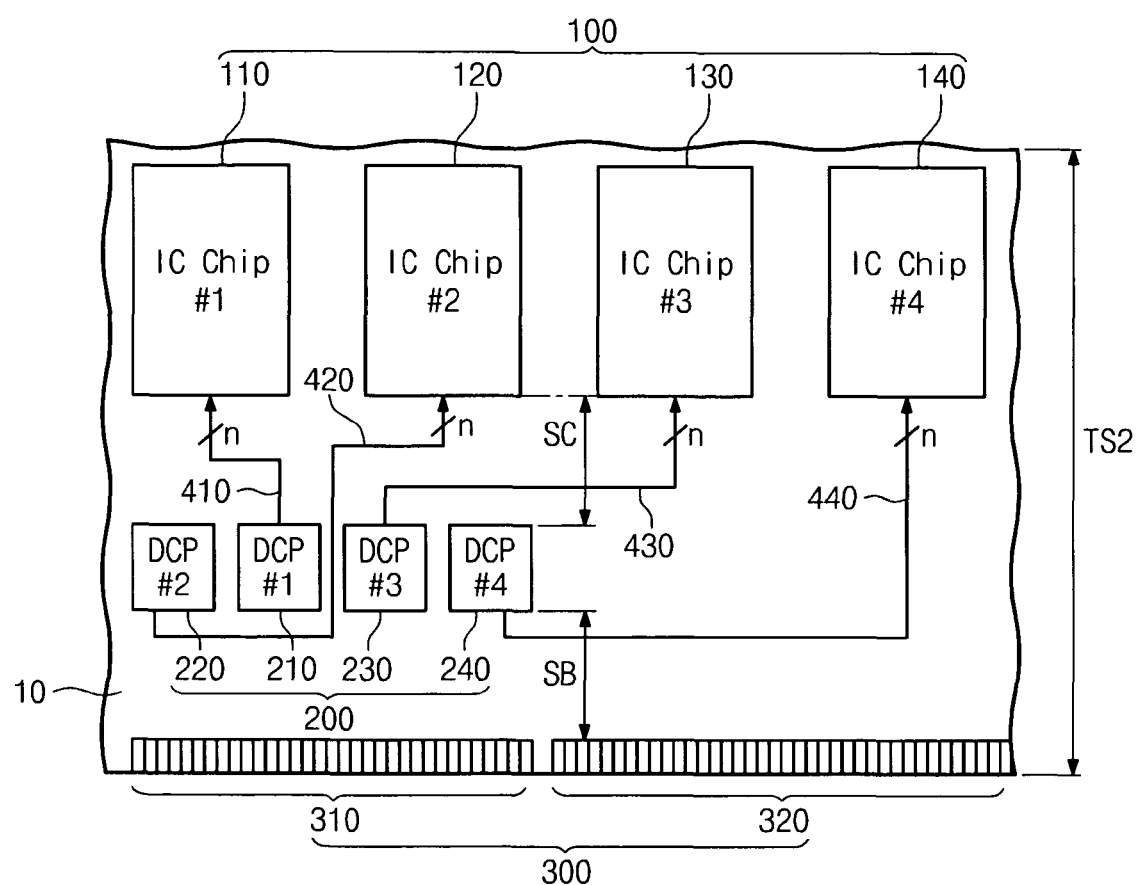

FIGS. 15 and 16 are diagrams of printed circuit boards illustrating a portion of a memory module according to example embodiments of the inventive concepts. Referring to FIGS. 15 and 16, each of the memory modules of FIG. 15 and FIG. 16 may have substantially the same configuration as the memory module of FIG. 5 with the exception of the decoupling part position ordering. In FIG. 15, the decoupling parts 200 may have an ordering, from left to right, of the first decoupling part 210, the second decoupling part 220, the fourth decoupling part 240 and the third decoupling part 230. In FIG. 16, the decoupling parts 200 may have an ordering, from left to right, of the second decoupling part 220, the first decoupling part 210, the third decoupling part 230, and the fourth decoupling part 240.

Figure 6:
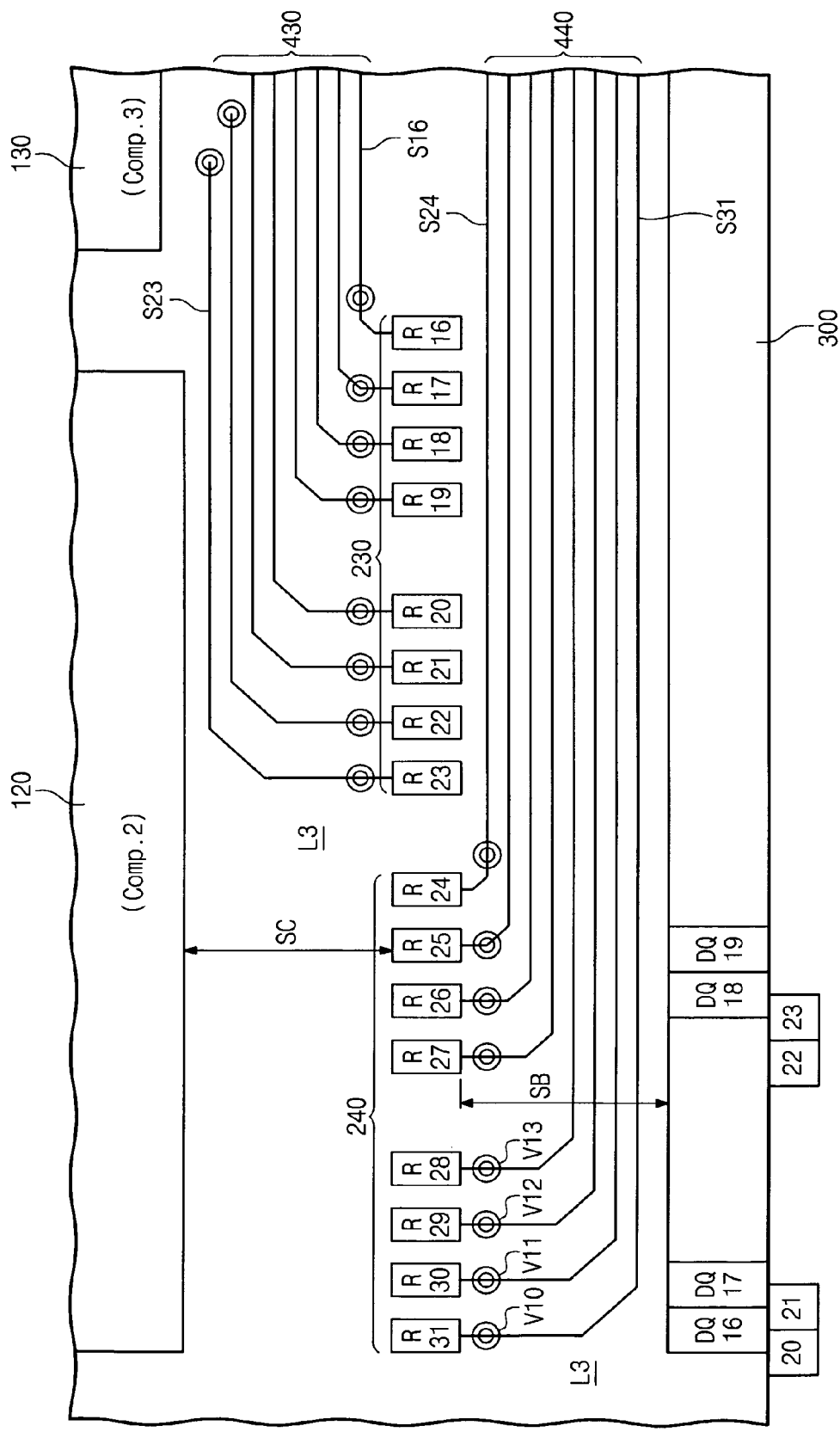
Figure 7:
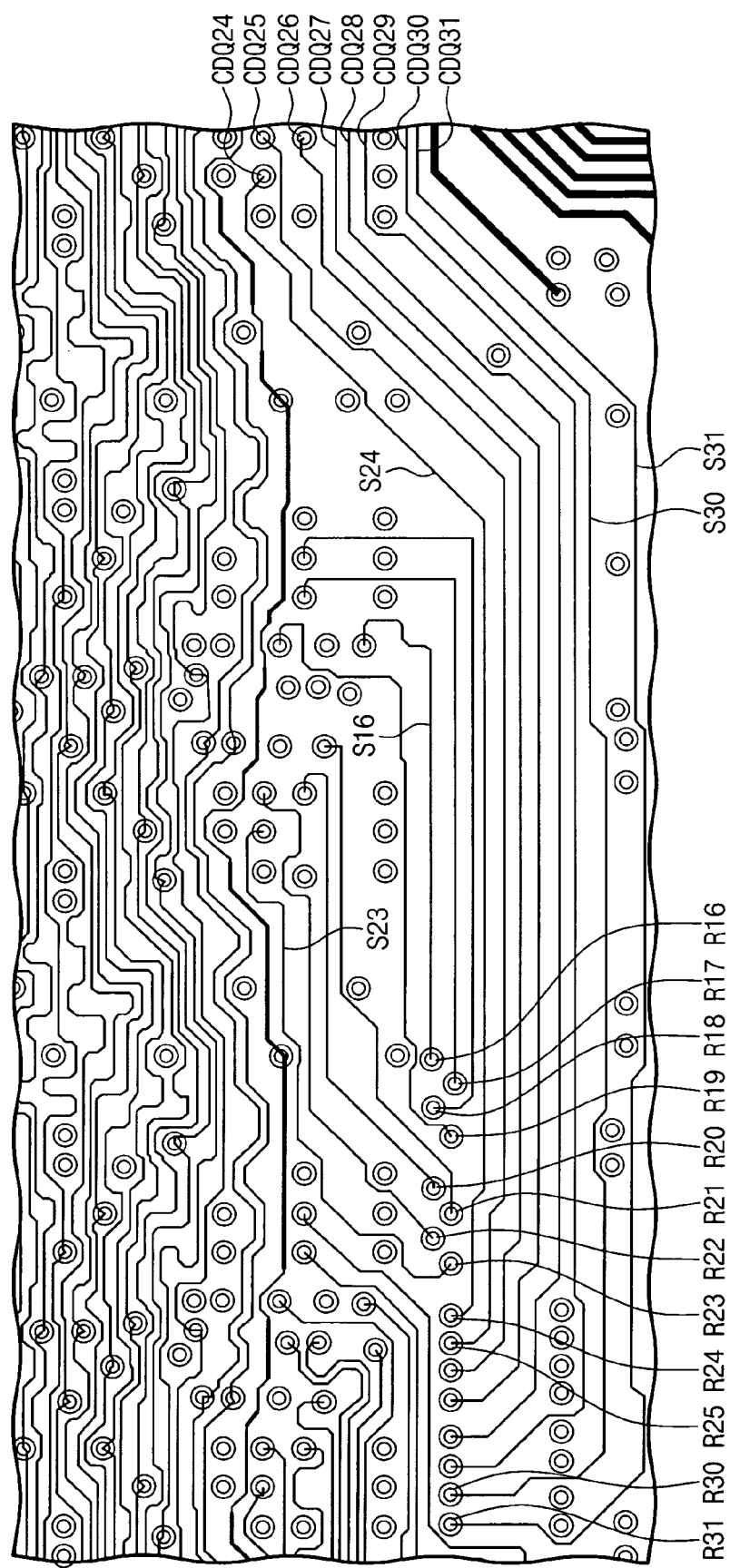
Figure 8:
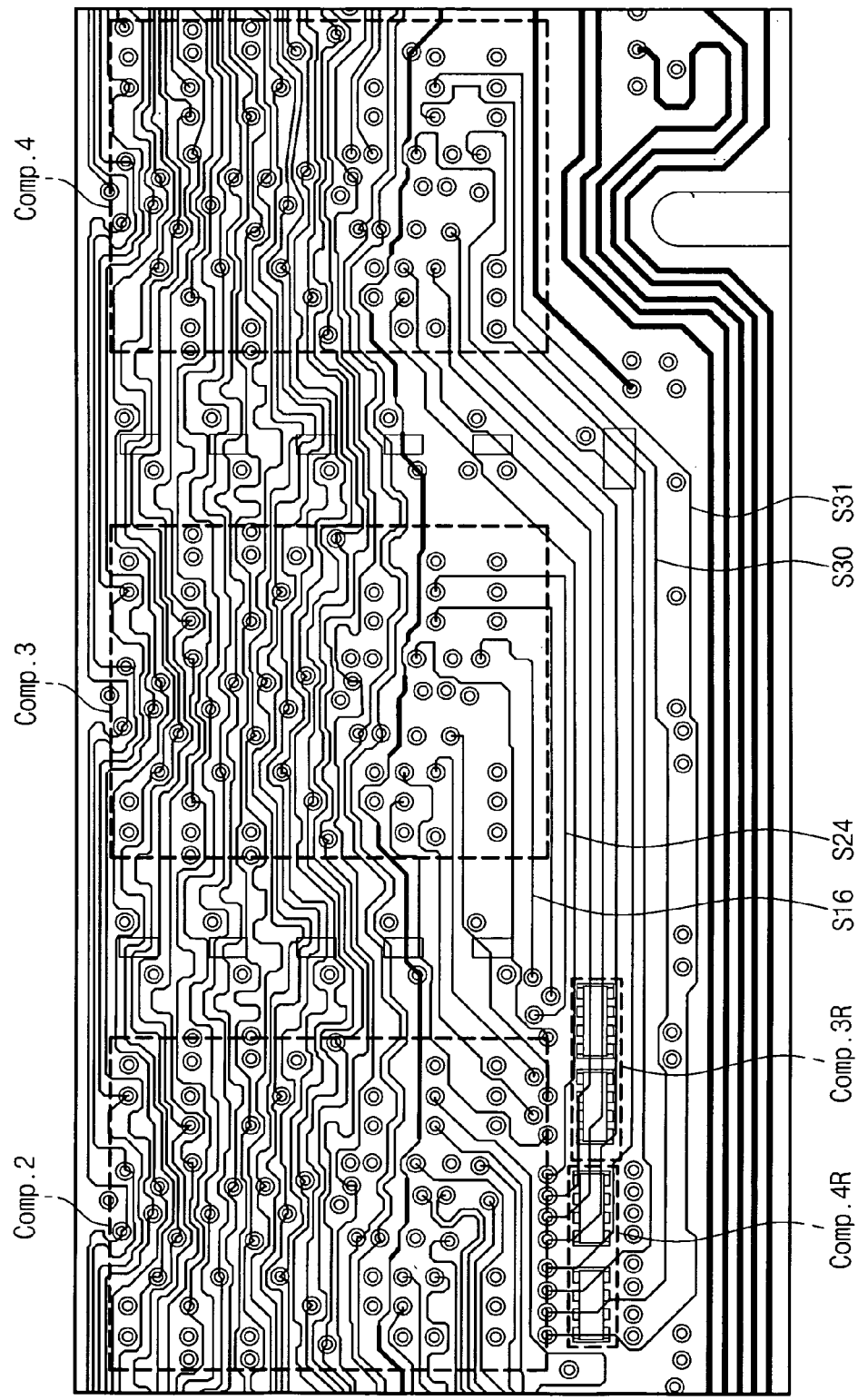

FIG. 6 is a diagram of a printed circuit board illustrating an example layout of the memory module of FIG. 5 according to example of embodiments of the inventive concepts. FIG. 7 is a diagram illustrating internal layer detail of the printed circuit board of FIG. 6 according to example of embodiments of the inventive concepts. FIG. 8 is a diagram illustrating the positions of components to be mounted over the layout pattern of the internal layer of FIG. 7 according to example of embodiments of the inventive concepts.

Referring to FIG. 6, the second memory device 120, the third memory device 130, the fourth decoupling part 240 and the third decoupling part 230 may be shown. Signal lines 430 and 440 may be in the first distance region SC and in the second distance region SB, respectively. For convenience of explanation, the signal line 430 may be called the first signal line group and the signal line 440 may be called the second signal line group. The first signal line group 430 may be in the first distance region SC between the memory devices 100 and the decoupling parts 200 (e.g. damping resistors R16-R31) and the second signal line group 440 may be in the second distance region SB between the decoupling parts 200 and the tab 300 (e.g., tab pins DQ16-DQ19).

The second signal line group 440 may be shown as lines S24 to S31 and may connect damping resistors R24-R31 (R26-29 are not labeled) in FIG. 7 to a corresponding one of reference numbers CDQ24-CDQ31 in FIG. 7. The first signal line group 420 may be shown as lines S16-S23 connected to each of damping resistors R16-R23. Each of the reference numbers CDQ may denote a data pin DQ of a memory device. By disposing the first signal line group 430 and the second signal line group 440 in the first distance region and the second distance region, respectively, the average distance of signal line S16-S31 is maximized and/or increased.

Referring to FIG. 6, the fourth decoupling part 240 includes damping resistors R24-R31 and the third decoupling part 230 includes damping transistors R16-R23. Each of damping resistors, a unit resistor, may include two resistors connected to each other in series. One damping resistor part may include a resistor array. The damping resistor part 240 may include 8 unit resistors R24-R31 that are in order from left to right along the length direction of the printed circuit board. The damping resistor part 230 may include 8 unit resistors R16-R23 that are in order from right to left along the length direction of the printed circuit board. According to example embodiments of the inventive concepts, 8 unit resistors is one unit for dispersion of the damping resistor part. However, example embodiments are not so limited and, for example, 4 unit resistors, 16 unit resistors and/or 32 unit resistors can be one unit for dispersion of the damping resistor part. The order of dispersion of unit resistors in one damping resistor may be changeable. For example, unit resistors in the damping resistor part 240 may be disposed from left to right with an ordering of R24, R25, R26, R27, R28, R29, R30 and R31.

Referring to FIG. 8, the position of module components on the uppermost layer (or lowermost layer) of the memory module having layout pattern of FIG. 7 may be shown. The memory device 120 may correspond to the rectangular area of a Comp. 2, the memory device 130 may correspond to the rectangular area of a Comp. 3, and the memory device 140 may correspond to the rectangular area of a Comp. 4. Two damping resistor parts Comp. 4R and Comp. 3R may correspond to the fourth decoupling part 240 and the third decoupling part 230, respectively, and may be near the memory device 120.

FIG. 9 is a diagram of a printed circuit board illustrating tab signaling formed on the upper and lower layer of a memory module including the layout pattern of FIG. 7. For clarity of explanation and understanding in FIG. 9, only 8 tab signals may be shown. Signal lines and tab pins on the bottom layer are drawn with dotted lines and dotted rectangles, respectively. In the case of a DIMM (Dual In-line memory module), tab connecting lines T10, T11, T12, T13 may be on the top layer of the printed circuit board having multiple layers, connecting tab pins DQ16, DQ17, DQ18, and DQ19, respectively, to their corresponding unit resistors R16, R17, R18 and R19. Tab connecting lines B10, B11, B12, and B13 may be on the bottom layer of the printed circuit board having multiple layers, connecting tab pins DQ20, DQ21, DQ22, and DQ23, respectively, to corresponding unit resistors R20, R21, R22 and R23. Extended connecting lines T14, T15, T16, and/or T17 may be formed on the top layer of the printed circuit board, to connect each of the connecting lines B10, B11, B12, and B13 to corresponding one of the unit resistors through vias.

Figure 10:
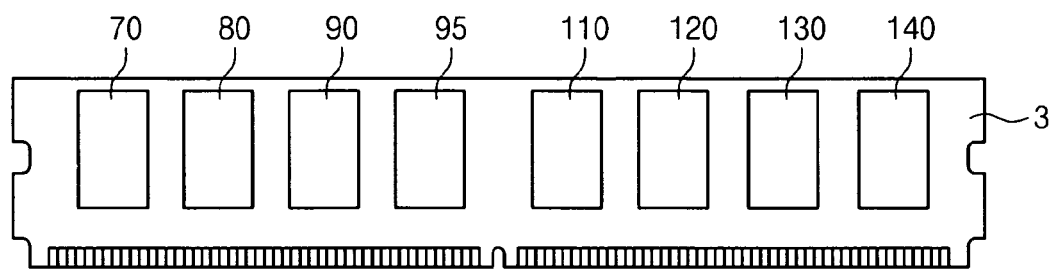
Figure 11:
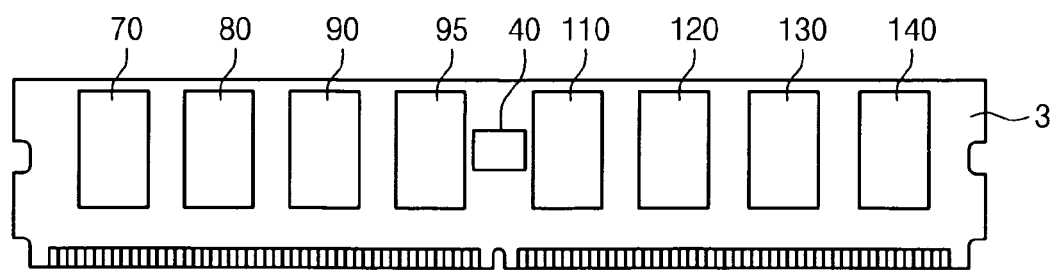

FIGS. 10 and 11 are plan views of memory modules 3 that may adopt a signal layout according to example of embodiments of the inventive concepts. FIG. 10 may be an example UDIMM not including a buffer. FIG. 11 may be an example RDIMM that may include a buffer 40 (e.g., for control signals and address signals).

Figure 12:
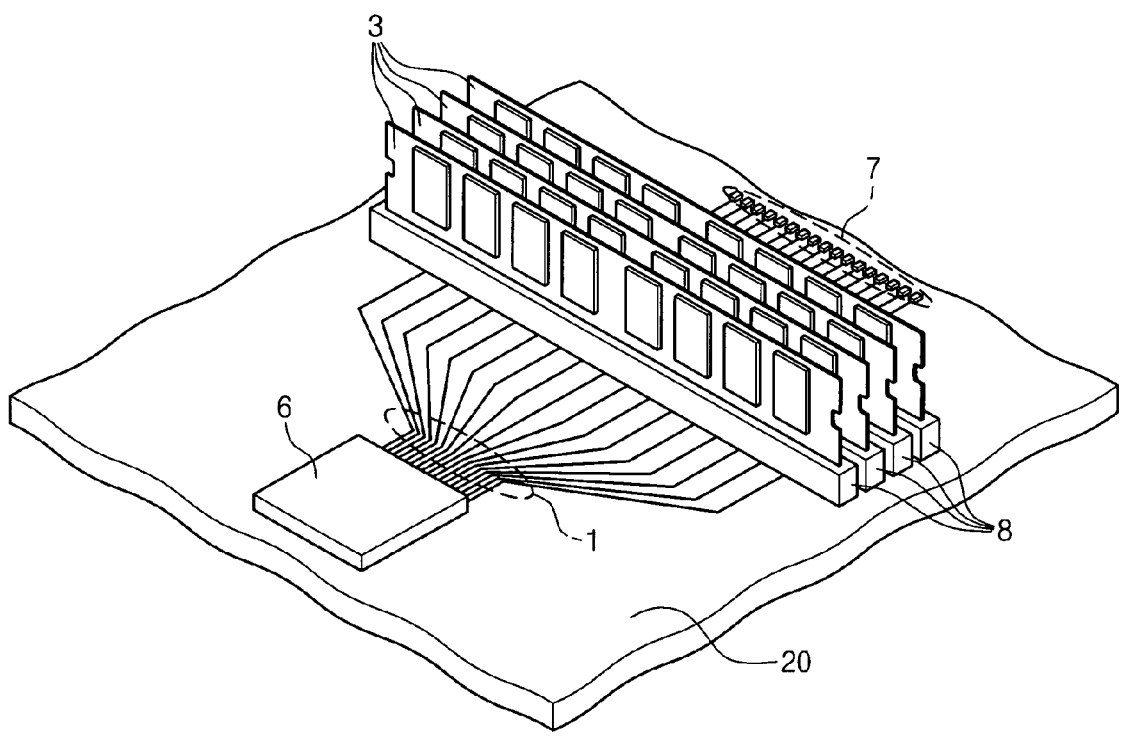

FIG. 12 is a diagram illustrating a memory system including a memory module according to example of embodiments of the inventive concepts. The memory system may include a memory controller 6 on a main board 20 and a plurality of connecting sockets 8. The memory controller 6 and the connecting sockets 8 may be connected to each other through a bus 1. The number of memory modules 3 that may be necessary for the memory system, each of which may have a layout structure according to example embodiments of the inventive concepts described above with reference to FIGS. 1-11, and may be inserted into the connecting sockets 8. The memory controller may include a plurality of termination resistors 7, each of which may be connected to a corresponding data signal, address signal, and/or command signal. Because each memory module 3 according to example embodiments of the inventive concepts may be used in the memory system, signal integrity of transmission signals to/from the memory module under control of the memory controller 6 may be improved.

Figure 13:
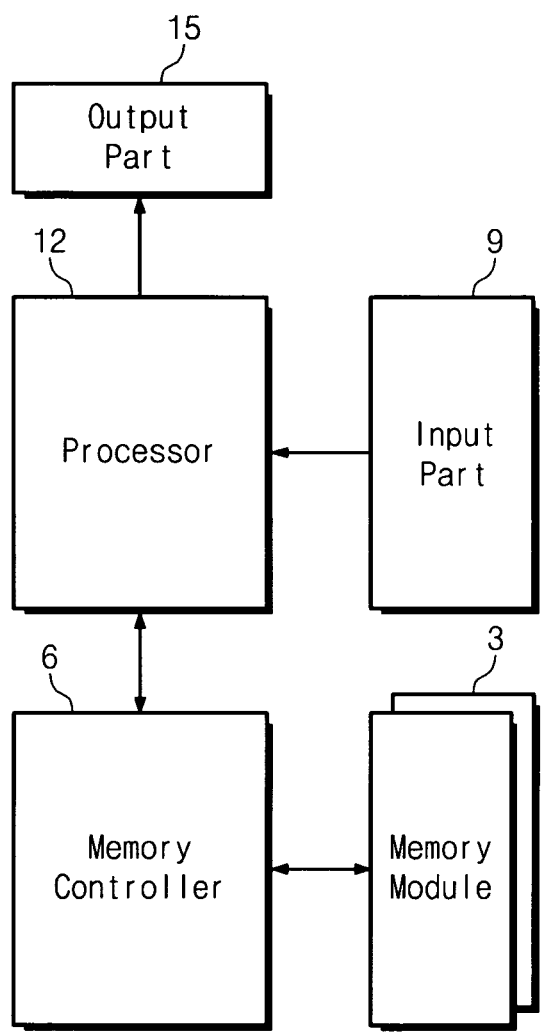

FIG. 13 is a block diagram illustrating a data processing system according to example of embodiments of the inventive concepts. Referring to the FIG. 13, the data processing system may include an input part 9, a processor 12, an output part 15, memory modules 3 and a memory controller 6. If the data processing system is a personal computer and/or laptop computer, the output part 15 may be one of a VGA card 15-1 and a monitor 15-2 as shown in FIG. 14.

Figure 14:
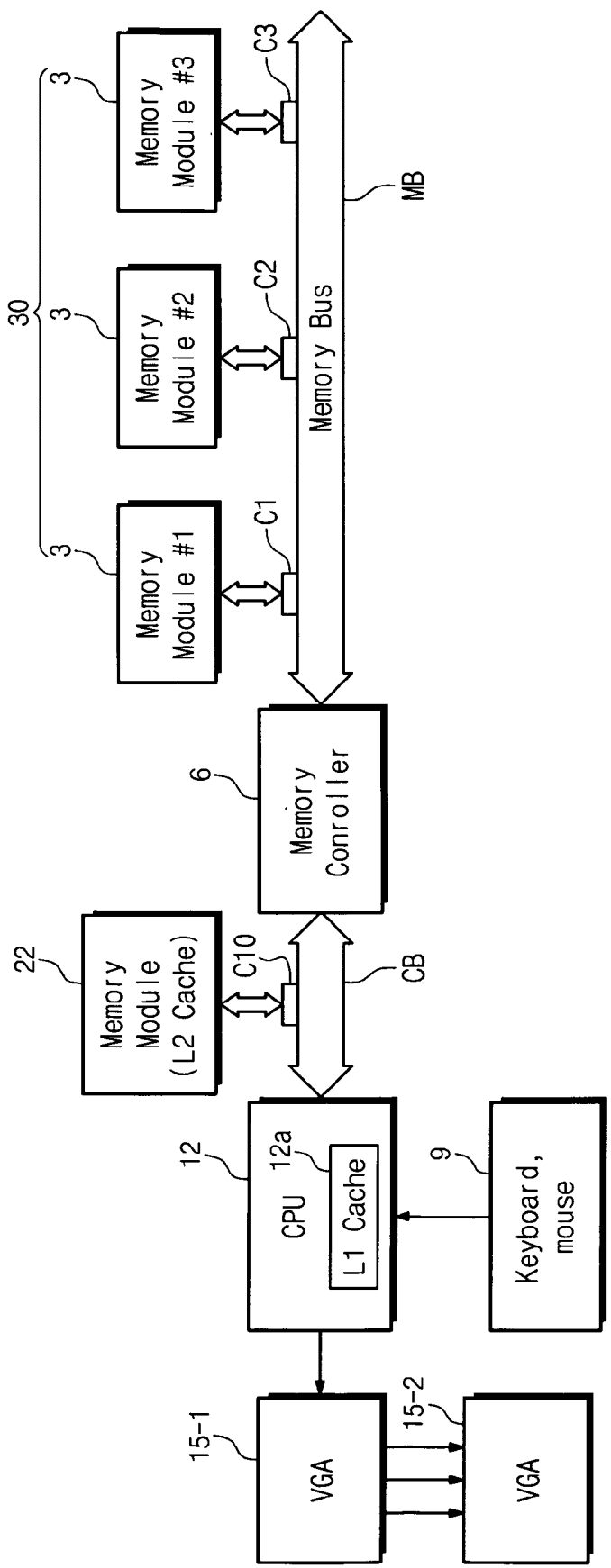

FIG. 14 is a block diagram illustrating details of the data processing system of FIG. 13. In the data processing system of FIG. 14, a memory module according to example embodiments of the inventive concepts may be used to increase and/or improve an amount of data to be stored into cache memory 22, and also to increase density of main memory 30. The data processing system of FIG. 14 may be, for example, a computer system including a CPU 12, a CPU bus CB, a memory controller 6, a memory bus MB and a main memory 30. The CPU 12 may include a L1 cache which stores frequently accessed data and/or commands. The CPU bus CB may include a connector socket C10 to permit a L2 cache to be added. The L2 cache may be a memory module 22 having a layout structure according to example embodiments of the inventive concepts, for example, as described with reference to FIG. 4 and/or FIG. 5. The memory module 22 for the L2 cache may be inserted into the socket C10 in order to be electrically connected to the CPU 12. The L2 cache may store frequently accessed data and/or commands similar to the L1 cache 12a. Normally, most frequently accessed data may be stored in the L1 cache 12a.

To increase the density of the main memory 30, the Memory Bus MB may be connected to a plurality of sockets C1, C2, C3. The memory modules 3 may be inserted into a corresponding one of the sockets and connected to the memory bus through connecting terminals, for example, a tab. As shown in FIG. 14, a plurality of memory modules 3 with low height having the same layout structure according to the example embodiments of the inventive concepts may be used to increase and/or improve the density of a main memory in a computer system. The computer system may have safer and increased accuracy data transfer between the CPU bus and/or the memory bus and the L2 cache memory and/or the main memory 30. Due to suppression of signal distortion and/or noise occurrence according to adopting the memory module having the same layout structure, for example, as shown in FIG. 4 and/or FIG. 5, electromagnetic interference (EMI) may also be improved. The cost of manufacturing the memory module with low height and improved and/or decreased crosstalk among signal lines may be lower.

Memory devices mounted on the memory modules 3 may be SDRAM, DDR SDRAM, DDR2 SDRAM, and/or DDR3 SDRAM. Memory devices mounted on the memory modules 3 may be ONEDRAM®, SRAM, and/or nonvolatile memory devices such as flash memory, PRAM, MRAM, and/or RRAM. The number of tabs of the memory module may be varied by the memory devices mounted on it. The memory module 3 adopting the same layout structure according to example embodiments of the inventive concept may be a 64 tab DIMM, 72 tab DIMM supporting ECC, 144 tab DIMM corresponding to SIMM, 168 tab DIMM, and/or SO-DIMM (Small Outline DIMM), all of which may be standardized by JEDEC (Joint Electron Device Engineering Council). A type of DIMM of the memory module may be an UDIMM, RDIMM, and/or FBDIMM (Fully Buffered DIMM).

A data processing system according to example embodiments of the inventive concept may be expanded to include more than two processors, which may be a microprocessor, a CPU, a digital processor, a microcontroller, a RISC processor, a CISC processor, and/or the like.

While example embodiments have been particularly shown and described, it will be understood by one of ordinary skill in the art that variations in form and detail may be made therein without departing from the spirit and scope of the claims.

What is claimed is:

1. A semiconductor module, comprising:
   a substrate;
   a plurality of integrated circuit devices on a surface of the substrate;
   a plurality of decoupling parts on the substrate;
   a plurality of connecting terminals on the substrate; and
   a plurality of signal lines connecting the integrated circuit devices to the decoupling parts;
   wherein the substrate is a printed circuit board,
   wherein the integrated circuit devices are memory devices,
   wherein the decoupling parts are a plurality of resistors,
   wherein the connecting terminals are included in a plurality of tabs,
   wherein the memory devices are connected to the tabs through the resistors,
   wherein the signal lines are in a first region between the integrated circuit devices and the decoupling parts,
   wherein the signal lines are in a second region between the decoupling parts and the connecting terminals,
   wherein the signal lines include a first signal line group in the first region and a second signal line group in the second region, and
   wherein the first region is distinct from the second region.

2. The semiconductor module of claim 1, wherein the substrate includes multiple layers,
   the signal lines are on an internal layer of the multiple layers, and
   the signal lines are connected to the surface of the substrate through a plurality of vias.

3. The semiconductor module of claim 1,
   wherein the first region is narrower than the second region in a height direction of the printed circuit board.

4. The semiconductor module of claim 1, wherein the first region is broader than the second region in a height direction of the printed circuit board.

5. The semiconductor module of claim 1, wherein the first and second signal line groups are configured to transfer data.

6. A semiconductor module, comprising:
   a substrate;
   a plurality of integrated circuit devices on a surface of the substrate;
   a plurality of decoupling parts on the substrate;
   a plurality of connecting terminals on the substrate; and
   a plurality of signal lines connecting the integrated circuit devices to the decoupling parts;
   wherein the signal lines are in a first region between the integrated circuit devices and the decoupling parts,
   wherein the signal lines are in a second region between the decoupling parts and the connecting terminals,
   wherein the substrate is a printed circuit board,
   wherein the integrated circuit devices are arranged in a first direction and have a first dispersion length,
   wherein the decoupling parts are spaced away from the integrated circuit devices in a second direction, the decoupling parts arranged in the first direction and having a second dispersion length, the second dispersion length shorter than the first dispersion length, and wherein the plurality of connecting terminals are spaced away from the decoupling parts in the second direction, the connecting terminals arranged in the first direction on an edge of the printed circuit board, the connecting terminals corresponding to the second dispersion length.

7. The semiconductor module of claim 6, wherein the integrated circuit devices are memory devices, and
the decoupling parts include at least one of damping resistors and capacitors.

8. The semiconductor module of claim 6, wherein the second direction is a height of the printed circuit board, and
the first direction is a length of the printed circuit board.

9. The semiconductor module of claim 7, wherein the connecting terminals are tabs of the semiconductor module, and
the tabs are connected to a memory controller through a socket.

10. The semiconductor module of claim 6, wherein the signal lines are configured to transfer at least one of data and addresses.

11. The semiconductor module of claim 6, wherein the printed circuit board includes multiple layers, and
the plurality of signal lines includes a first signal line group in the first region and a second signal line group in the second region.

12. The semiconductor module of claim 11, wherein the first and the second signal line groups are in at least one internal layer of the multiple layers.

13. The semiconductor module of claim 11, wherein the decoupling parts include at least one of resistors and capacitors, and
the decoupling parts are configured to reduce signal noise and to improve signal integrity.

14. A data processing system, comprising:
a memory controller;
a processor connected to the memory controller, the processor configured to process a requested data operation; and
a memory module connected to the memory controller;
wherein the memory module includes,
a plurality of memory devices connected to a plurality of tabs through a plurality of damping resistor parts on a printed circuit board,
a first signal line group in a first region between the memory devices and the damping resistor parts, and
a second signal line group in a second region between the damping resistor parts and a plurality of connecting terminals of the printed circuit board.

15. The data processing system of claim 14, wherein the printed circuit board includes a plurality of layers, and
the first and second signal line groups are in an internal layer of the printed circuit board.

16. The data processing system of claim 15, wherein the first and the second signal line groups are configured to transfer at least one of data, commands, and addresses.

17. The data processing system of claim 16, wherein the data processing system is at least one of a computer and a multi-media electronic apparatus.

18. A memory module signal line layout method, comprising:
arranging memory devices on a printed circuit board;
arranging damping resistor parts on the printed circuit board, the damping resistor parts having exchangeable positions such that the damping resistor parts are positioned based on a selected routing of signal lines;
arranging tabs on the printed circuit board, the memory devices connected to the tabs through the damping resistor parts;
arranging a first signal line group in a first region between the memory devices and the damping resistor parts; and
arranging a second signal line group in a second region between the damping resistor parts and the tabs.

19. The signal line layout method of claim 18, wherein the arranging of the damping resistor parts includes exchanging positions of adjacent damping resistor parts of the damping resistor parts.

* * * * *